(12) United States Patent
Okumura

(10) Patent No.: US 7,442,972 B2
(45) Date of Patent: Oct. 28, 2008

(54) SEMICONDUCTOR DEVICE AND INSPECTION METHOD THEREOF

(75) Inventor: Yoichi Okumura, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 11/366,269

(22) Filed: Mar. 2, 2006

(65) Prior Publication Data

US 2006/0197174 A1 Sep. 7, 2006

(30) Foreign Application Priority Data

Mar. 2, 2005 (JP) ............................. 2005-057155

(51) Int. Cl.
*H01L 31/062* (2006.01)
(52) U.S. Cl. ............................. 257/290; 257/E33.045
(58) Field of Classification Search ................. 257/347, 257/461, 290
See application file for complete search history.

(56) References Cited

U.S. PATENT DOCUMENTS

| 3,886,579 | A * | 5/1975 | Ohuchi et al. ............... 257/438 |
| 6,252,286 | B1 * | 6/2001 | Arai ............................ 257/446 |
| 6,392,282 | B1 * | 5/2002 | Sahara et al. ................ 257/438 |
| 2003/0168709 | A1 * | 9/2003 | Kashiura ..................... 257/458 |

FOREIGN PATENT DOCUMENTS

JP 2001-320079 11/2001

\* cited by examiner

*Primary Examiner*—Wai-Sing Louie
*Assistant Examiner*—Bilkis Jahan
(74) *Attorney, Agent, or Firm*—Frederick J. Telecky, Jr.; Wade J. Brady, III

(57) ABSTRACT

A semiconductor device is disclosed. The device has a photodiode isolated by element isolating regions (Ia, 14a, 14b) characterized by the following facts: on the principal surface of first semiconductor layer 11 of the first electroconductive type, second semiconductor layer 12 of the second electroconductive type is formed; element isolating region Ia of the first electroconductive type is formed extending through the second semiconductor layer to reach the outer layer portion of the first semiconductor layer so as to isolate the photodiode region; to the outside of the photodiode region isolated by the element isolating regions, moat region E of the second electroconductive type is formed extending through the second semiconductor layer to reach the outer layer portion of the first semiconductor layer; a voltage different from that applied to the second semiconductor layer in the photodiode region is applied to the moat region, and based on the current flowing between the moat region and the second semiconductor layer in the photodiode region, the presence/absence of an inversion layer of the second electroconductive type formed in the outer layer portion of the first semiconductor layer is detected.

8 Claims, 4 Drawing Sheets

SEMICONDUCTOR DEVICE AND INSPECTION METHOD THEREOF

FIELD OF THE INVENTION

The present invention pertains to a semiconductor device and its inspection method. In particular, the present invention pertains to a type of semiconductor device having a photodiode and its inspection method.

In semiconductor devices, photodiodes are diodes that receive light and generate current, and they are widely used as light receiving elements for the optical pickup devices contained in CD, DVD, and other optical disk devices. Each photodiode is made of a pn junction semiconductor, and as a reverse bias is applied to the pn junction, the depletion layer spreads and a high electric field is applied. Primarily because of the light absorbed in the depletion layer, electron-hole pairs are generated, and the electric field drives the electrons to move to the n-type semiconductor region, and the holes to move to the p-type semiconductor region. The current generated is detected.

Types of these photodiodes include the PIN photodiode, which has an intrinsic layer (hereinafter to be referred to as an I layer), such as a p$^-$-layer or n$^-$-layer with a low concentration of an electroconductive impurity between a p-type layer and an n-type layer, and in which the depletion layer spreads easily at a low voltage, the avalanche photodiode that has a region where avalanche breakdown takes place, etc.

Patent Reference 1 discloses such a photodiode. FIG. 3(A) is a cross section illustrating an example of such a photodiode.

For example, on p$^{++}$-type silicon semiconductor substrate 100, p$^-$-type epitaxial layer 101 is formed as the I layer, and n-type epitaxial layer 102 is formed on it so that a pn junction is formed. In addition, in the PIN photodiode region, n$^+$-type semiconductor region 103 is formed in the outer layer portion of n-type epitaxial layer 102, and LOCOS element isolating insulating film 104a is formed to surround the PIN photodiode region. Then, on the outer periphery of the film, element isolating region I made of p$^{++}$-type semiconductor regions 105, 106, 107 is formed in the outer layer portion extending from n-type epitaxial layer 102 to p$^-$-type epitaxial layer 101. Then, LOCOS element isolating insulating film 104b is formed around its outer periphery.

Ring-shaped electrode 108 made of a metal layer is formed around the outer periphery of each PIN photodiode region extending from the upper layer of n$^+$-type semiconductor region 103 to element isolating insulating film 104a. On the other hand, electrode 109 is formed such that it is connected to p$^{++}$-type semiconductor region 107 that forms part of element isolating region I.

An interlayer insulating film, not shown in the figure, is formed on the region except for the PIN photodiode region, and a surface protective layer is formed to cover the entirety of these regions.

As a result, a PIN photodiode with the aforementioned constitution is formed.

For the PIN photodiode with the aforementioned constitution, as a reverse bias is applied to n$^+$-type semiconductor region 103 and p$^-$-type epitaxial layer 101, the depletion layer spreads from the pn junction, and when light is injected into the formed depletion layer, electron-hole pairs are generated, and an optical signal is obtained.

Here, electrode 108 is an electroconductive layer connected to n$^+$-type semiconductor region 103, and a voltage can be applied via electrode 108 to n$^+$-type semiconductor region 103.

The PIN photodiode can be manufactured as follows.

For example, p-type epitaxial layer 101 as the I layer and n-type epitaxial layer 102 are grown by the epitaxial growth method on p$^{++}$-type silicon semiconductor substrate 100. During the epitaxial growth, a p-type impurity is introduced to form p$^{++}$-type semiconductor regions 105, 106, and LOCOS element isolating insulating film portions 104a, 104b are then formed for element separation.

In addition, in the outer layer portion of n-type epitaxial layer 102, p$^{++}$-type semiconductor region 107 is formed connected to p$^{++}$-type semiconductor regions 105, 106 by introducing a p-type impurity, and an n-type impurity is introduced to form n$^+$-type semiconductor region 103.

In addition, a TiW or other metal layer is deposited by sputtering, and electrodes 108, 109 connected to n$^+$-type semiconductor region 103 and p$^{++}$-type semiconductor region 107, respectively, are formed by a patterning process The p-type epitaxial layer 101 serving as the I layer, however, is caused by the very low impurity concentration with a resistivity of, for example, about 10 kΩ-cm. Because of the contamination in the film growth process due to the epitaxial growth, n$^-$-type inversion layer 101R is formed in the outer layer portion of p-type epitaxial layer 101, as shown in FIG. 3(B).

As explained above, because n$^-$-type inversion layer 101R is formed, the pn junction capacitance varies, and the voltage dependence of the junction capacitance changes, so that even when the prescribed voltage is applied, the desired junction capacitance still cannot be obtained, and the photodiode characteristics deteriorate.

In order to detect this deterioration in the characteristics of the photodiode, the photodiode is irradiated with light, such as from a laser beam, and the characteristics of the photodiode are measured from its output.

As shown in FIG. 4, in a PDIC (photodiode IC) having a photodiode integrated in it, in addition to the photodiode PD there is usually also an integrated dummy photodiode PDd for reference of the dark current, with the photosensitive region shielded by an aluminum film or the like. The outputs of photodiode PD and dummy photodiode PDd are input to amplifier A to get the difference, which is output as the optical signal output by means of photodiode PD.

In the aforementioned test for detecting deterioration of the photodiode, a test light is usually shown through a transparent package after the PDIC is assembled in a package form, and its output is measured.

Consequently, detection of PDICs with defects due to deterioration of the characteristics is performed after package assembly. As a result, the package has to be discarded when defects are found so that the manufacturing costs increase. In particular, this becomes a major problem because the clear package is more expensive than the conventional package.

BACKGROUND OF THE INVENTION

The objective of the present invention is to solve the aforementioned problems of the prior art by providing a type of semiconductor device, as well as its inspection method, characterized by the fact that in a photodiode comprising a pn junction and containing an intrinsic layer or the like, the presence/absence of an inversion layer formed in the outer layer portion of the intrinsic layer can be detected before assembly of the package.

SUMMARY OF THE INVENTION

In order to realize the aforementioned objective, the present invention provides a type of semiconductor device characterized by the fact that the semiconductor device has a photodiode formed on it and isolated by element isolating regions, and the semiconductor device has the following parts: a first semiconductor layer of a first electroconductive type, a second semiconductor layer of a second electroconductive type formed on the principal surface of the first semiconductor layer, element isolating regions of the first electroconductive type each formed extending through the second semiconductor layer to reach the outer layer portion of the first semiconductor layer in order to isolate the photodiode, and moat regions of the second electroconductive type, each of which is formed extending through the second semiconductor layer to the outside of the photodiode region isolated by the element isolating regions and reaching the outer layer portion of the first semiconductor layer, a prescribed voltage different from the voltage applied to the second semiconductor layer in the photodiode region is applied to the moat region, and the current flowing between it and the second semiconductor layer in the photodiode region serves for detection of the presence/absence of an inversion layer of the second electroconductive type formed in the outer layer portion of the first semiconductor layer.

For the semiconductor device of the present invention, a photodiode is formed and isolated by element isolating regions. In this semiconductor device, the second semiconductor layer of the second electroconductive type is formed on the principal surface of the first electroconductive type, and each element isolating region of the first electroconductive type is formed extending through the second semiconductor layer to reach the outer layer portion of the first semiconductor layer so that the photodiode regions are isolated from each other.

In addition, to the outside of the photodiode regions isolated by the element isolating regions are formed moat regions of the second electroconductive type with the following function: each of the moat regions is formed extending through the second semiconductor layer to the outside of the photodiode region isolated by the element isolating regions and reaching the outer layer portion of the first semiconductor layer, a prescribed voltage different from the voltage applied to the second semiconductor layer in the photodiode region is applied to the moat region, and the current flowing between it and the second semiconductor layer in the photodiode region serves for detection of the presence/absence of an inversion layer of the second electroconductive type formed in the outer layer portion of the first semiconductor layer.

Also, the present invention pertains to the semiconductor device characterized by the fact that the moat regions are formed individually at plural locations to the outside of the photodiode regions. Also, the following scheme is preferred: the moat regions are formed in a ring shape around the outer periphery of the photodiode regions.

Also, it is preferred that current flow between the moat regions and the second semiconductor layer in the photodiode regions.

In order to realize the aforementioned objective, the present invention provides a type of semiconductor device having a photodiode characterized by the fact that it has the following parts: a first semiconductor layer of a first electroconductive type, a second semiconductor layer of the first electroconductive type formed on the first semiconductor layer and having an impurity concentration lower than that of the first semiconductor layer, a third semiconductor layer of a second electroconductive type formed on the second semiconductor layer, a fourth semiconductor layer of a second electroconductive type formed on the third semiconductor layer and having an impurity concentration higher than that of the third semiconductor layer, first semiconductor regions of the first electroconductive type and formed extending through the third semiconductor layer from the surface of the third semiconductor layer to reach the second semiconductor layer such that the fourth semiconductor layer is surrounded, and second semiconductor regions of the second electroconductive type and formed extending through the third semiconductor layer from the surface of the third semiconductor layer to reach the second semiconductor layer to the outside of the first semiconductor regions.

For the semiconductor device of the present invention, a second semiconductor layer of the first electroconductive type with an impurity concentration lower than that of the first semiconductor layer is formed on the first semiconductor layer of the first electroconductive type; a third semiconductor layer of the second electroconductive type is formed on the second semiconductor layer; and a fourth semiconductor layer with an impurity concentration higher than the third semiconductor layer is formed on the third semiconductor layer. Then, a first semiconductor region of the first electroconductive type is formed extending through the third semiconductor layer from the surface of the third semiconductor layer to the second semiconductor layer so that the fourth semiconductor layer is surrounded. To the outside of the first semiconductor region, a second semiconductor region of the second electroconductive type is formed extending through the third semiconductor layer from the surface of the third semiconductor layer to reach the second semiconductor layer. In this way, the photodiode is formed.

For the semiconductor device of the present invention, it is preferred that it have third semiconductor regions of the first electroconductive type formed extending through the third semiconductor layer from the surface of the third semiconductor layer to the second semiconductor layer to the outside of each the second semiconductor region.

Also, it is preferred that it have first metal electrodes connected to the fourth semiconductor layer, and second metal electrodes connected to the second semiconductor region.

In addition, it is preferred that when inspection of the photodiode is performed, different voltages be applied to each the first metal electrode and each the second metal electrode to determine conduction between the first metal electrode and the second metal electrode.

In addition, in order to realize the aforementioned objective, the present invention provides a semiconductor device inspection method characterized by the fact that the inspection method for semiconductor device that has a photodiode isolated by element isolating regions, has the following process steps: a step in which different prescribed voltages are applied to the second semiconductor layer in the photodiode regions and the moat regions in a semiconductor device having the following parts: a first semiconductor layer of a first electroconductive type, a second semiconductor layer of a second electroconductive type formed on the principal surface of the first semiconductor layer, element isolating regions of the first electroconductive type each formed extending through the second semiconductor layer to reach the outer layer portion of the first semiconductor layer so as to isolated the photodiode, and moat regions of the second electroconductive type, each of which is formed extending through the second semiconductor layer to the outside of the photodiode region isolated by the element isolating regions and reaching the outer layer portion of the first semiconductor layer; and a step in which, by means of the current flowing between the second semiconductor layer in the photodiode regions and the moat regions, the presence/absence of an inversion layer of the second electroconductive type formed in the outer layer portion of the first semiconductor layer is detected.

In the aforementioned semiconductor device inspection method of the present invention, the semiconductor device has the following structure: on the principal surface of a first semiconductor layer of a first electroconductive type, a second semiconductor layer of a second electroconductive type is formed; element isolating regions of the first electroconductive type are formed extending through the second semiconductor layer to reach the outer layer portion of the first semiconductor layer in order to isolate photodiode regions from each other. In addition, to the outside of each photodiode region isolated by the element isolating regions, moat regions of the second electroconductive type are formed extending through the second semiconductor layer to reach the outer layer portion of the first semiconductor layer. For the semiconductor device, different prescribed voltages are applied to the second semiconductor layer in the photodiode region and the moat region, respectively, and by means of the current flowing between the second semiconductor layer in the photodiode region and the moat region, the presence/absence of an inversion layer of the second electroconductive type formed in the outer layer portion of the first semiconductor layer is detected.

For the aforementioned semiconductor device inspection method of the present invention, the following scheme is preferred: before the step of packaging the semiconductor device, the following process steps are performed: a step in which different prescribed voltages are applied to the second semiconductor layer in the photodiode regions and the moat regions, respectively, and a step in which the presence/absence of an inversion layer of the second electroconductive type formed in the outer layer portion of the first semiconductor layer is detected. In addition, the following is preferred: the following process steps are performed at the wafer level: a step in which different prescribed voltages are applied to the second semiconductor layer in the photodiode regions and the moat regions, respectively, and a step in which the presence/absence of an inversion layer of the second electroconductive type formed in the outer layer portion of the first semiconductor layer is detected.

In addition, the following scheme is preferred: inspection is performed for a semiconductor device that has the moat regions formed at plural sites to the outside of the photodiode regions.

Also, it is preferred that inspection be performed for a semiconductor device that has the moat regions formed in a ring shape surrounding the outer periphery of the photodiode region.

In addition, it is preferred that checking be performed for a semiconductor device for which the characteristics of the photodiode are changed by causing a current to flow between the moat regions and the second semiconductor layer in the photodiode regions.

REFERENCE NUMERALS AND SYMBOLS AS SHOWN IN THE DRAWINGS

In the figures, 10, 100 represent a $p^{++}$-type silicon semiconductor substrate; 11, 101 represent a $p^{-}$-type epitaxial layer; 11R, 101R represent an inversion layer; 12, 102 represent an n-type epitaxial layer; 13, 103 represent an $n^{+}$-type semiconductor region; 14a, 14b, 14c, 104a, 104b represent a LOCOS element isolating insulating film; 15, 16, 17, 24, 25, 105, 106, 107 represent a $p^{++}$-type semiconductor region; 20, 21, 22 represent an $n^{++}$-type semiconductor region; 18, 19, 23, 108, 109 represent an electrode; Ia, Ib, I represent an element isolating region: E represents a mover electrode; PD represents a photodiode; PDd represents a dummy photodiode; A represents an amplifier.

DESCRIPTION OF THE EMBODIMENTS

For the semiconductor device of the present invention, which has a photodiode comprising a pn junction containing an intrinsic layer or the like, it is possible to detect the presence/absence of an inversion layer in the outer layer portion of the intrinsic layer before assembly of the package.

According to the inspection method of the semiconductor device of the present invention, when inspecting a semiconductor device having a photodiode comprising a pn junction containing an intrinsic layer, it is possible to detect the presence/absence of an inversion layer formed in the outer layer portion of the intrinsic layer before assembly of the package.

In the following, the semiconductor device of the present invention and its inspection method will be explained with reference to figures.

Figure 1A:
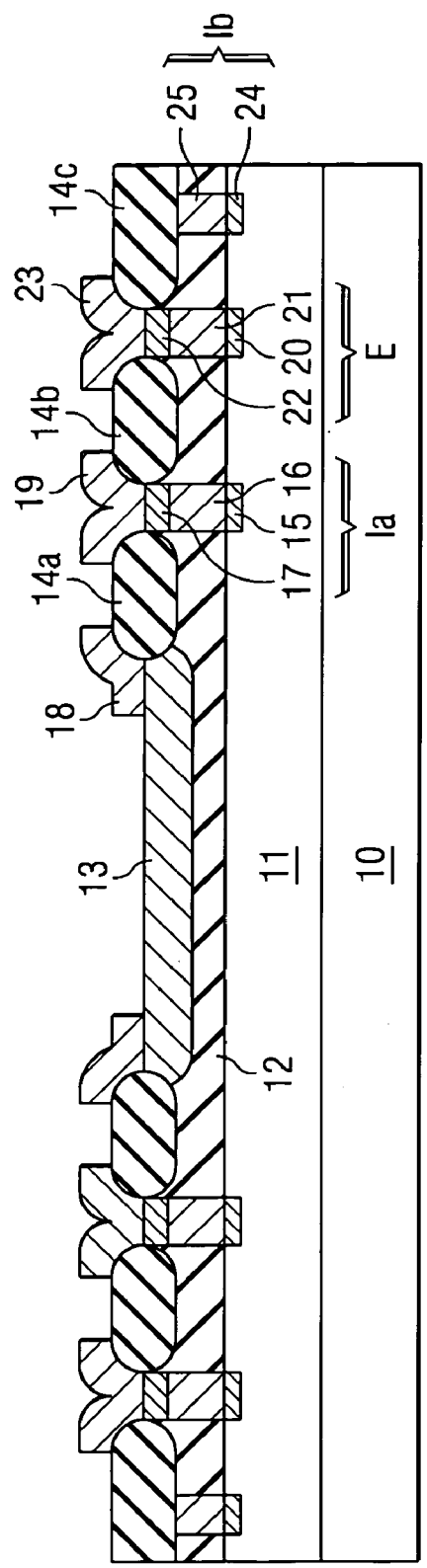
FIG. 1(A) is a cross section of the semiconductor device pertaining to the embodiment of the present invention.

FIG. 1(A) is a cross section of the semiconductor device comprising a photodiode in the present embodiment.

For example, $p^{-}$-type epitaxial layer 11 as an I layer is formed on $p^{++}$-type silicon semiconductor substrate 10. On this layer, n-type epitaxial layer 12 is formed so that a pn junction is formed. In addition, $n^{+}$-type semiconductor region 13 is formed in the PIN photodiode region in the outer layer portion of n-type epitaxial layer 12, LOCOS element isolating insulating film 14a is formed to surround the PIN photodiode region, and then element isolating region Ia made of $p^{++}$-type semiconductor regions 15, 16, 17 is formed around its outer periphery extending from n-type epitaxial layer 12 to the outer layer portion of $p^{-}$-type epitaxial layer 11. In addition, LOCOS element isolating insulating film 14b is formed around its outer periphery.

In addition, around the outer periphery of the photodiode region, at plural sites or in a ring shape around the outer periphery of the photodiode region, moat regions E made of $n^{++}$-type semiconductor regions 20, 21, 22 are formed extending from n-type epitaxial layer 12 to the outer layer portion of $p^{-}$-type epitaxial layer 11 via element isolating region Ia and element isolating insulating film 14b.

In addition, LOCOS element isolating insulating film 14c is formed around its outer periphery. Below this film, element isolating region Ib made of $p^{++}$-type semiconductor regions 24, 25 is formed extending from n-type epitaxial layer 12 to the outer layer portion of p⁻-type epitaxial layer 11.

Ring-shaped electrode 18 made of a metal is formed extending from the upper layer of n⁺-type semiconductor region 13 at the outer periphery of the PIN photodiode region onto element isolating insulating film 14a. On the other hand, electrode 19 is formed connected to p⁺⁺-type semiconductor region 17 that forms element isolating region Ia.

Also, electrode 23 is formed connected to n⁺⁺-type semiconductor region 22 that forms moat regions E.

In the regions except for the PIN photodiode region, an interlayer insulating film, not shown in the figure, is formed as needed, and a surface protective layer is formed to cover the entirety of these parts.

As a result, a PIN photodiode with the aforementioned constitution is formed.

In the PIN photodiode of the semiconductor device in the aforementioned embodiment, when a reverse bias is applied to n⁺-type semiconductor region 13 and p⁻-type epitaxial layer 11, the depletion layer spreads from the pn junction, and when light is incident on the depletion layer formed in this way, electron-hole pairs are generated and an optical signal is obtained.

Here, electrode 18 is an electroconductive layer connected to n⁺-type semiconductor region 13, and it is possible to apply a voltage to n⁺-type semiconductor region 13 via electrode 18.

Also, electrode 23 is an electroconductive layer connected to n⁺-type semiconductor region 22, and it is possible to apply a voltage to moat region E via electrode 23.

Figure 1B:
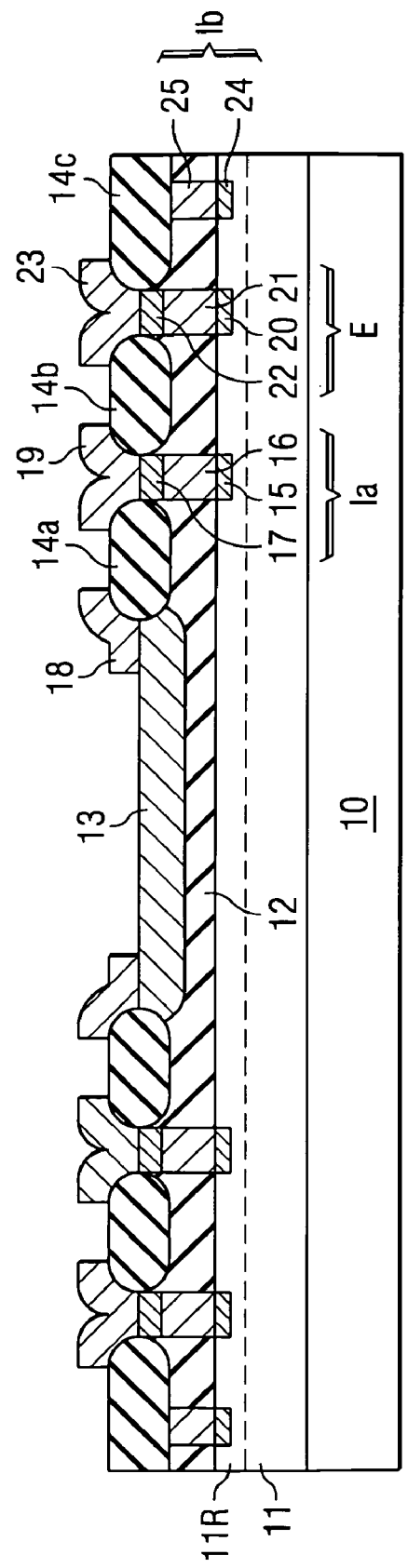
FIG. 1(B) is a cross section illustrating the state of formation of the inversion layer in the semiconductor device shown in FIG. 1(A).

However, for the p-type epitaxial layer 11 serving as the I layer, due to the very low impurity concentration with a resistivity of, for example, about 10 kΩ-cm, because of the contamination in the film growth process due to the epitaxial growth, as shown in FIG. 1(B), n⁻-type inversion layer 11R is formed on the outer layer portion of p-type epitaxial layer 111.

As explained above, when n⁻-type inversion layer 11R is formed, the pn junction capacitance varies, and the voltage dependence of the junction capacitance changes, so that even when the prescribed voltage is applied, the desired junction capacitance still cannot be obtained, and the photodiode characteristics degrade.

Here, for the PIN photodiode of the semiconductor device in the present embodiment, moat electrode E is formed to the outside of the photodiode region isolated by the element isolating regions. It passes extending through n-type epitaxial layer 12 (second semiconductor layer) to reach the outer layer portion of p⁻-type epitaxial layer 11 (first semiconductor layer), and when a prescribed voltage is applied to it that is different from the voltage applied to n-type epitaxial layer 12 in the photodiode region, the current flowing between it and n-type epitaxial layer 12 in the photodiode region makes it possible to detect the presence/absence of an n-type inversion layer formed in the outer layer portion of p⁻-type epitaxial layer 11.

As shown in FIG. 1(B), n⁻-type inversion layer 11R is formed in the outer layer portion of p-type epitaxial layer 111 in the region deeper than the bottom surface of p⁺⁺-type semiconductor region 15 that forms element isolating region Ia, and n-type epitaxial layer 12 in the photodiode region higher than the bottom surface of element isolating region Ia is electrically connected to moat electrode E.

For example, when current flows between moat region E and n-type epitaxial layer 12 in the photodiode region, the characteristics of the photodiode change, and the presence/absence of an inversion layer can be detected by detecting this change.

This detection of the inversion layer can be performed before assembly of the package, and by discarding the semiconductor devices found to have the inversion layer before packaging, it is possible to avoid the waste caused by disposal after formation of the package, as is done in the prior art.

Figure 2A:
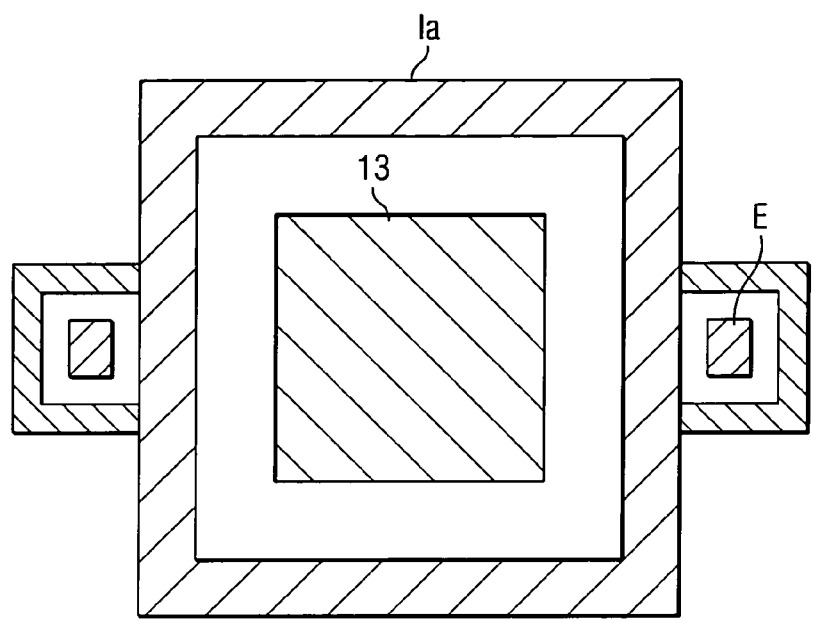
FIGS. 2(A) and (B) are plan views illustrating examples of layout of the moat regions.
Figure 2B:
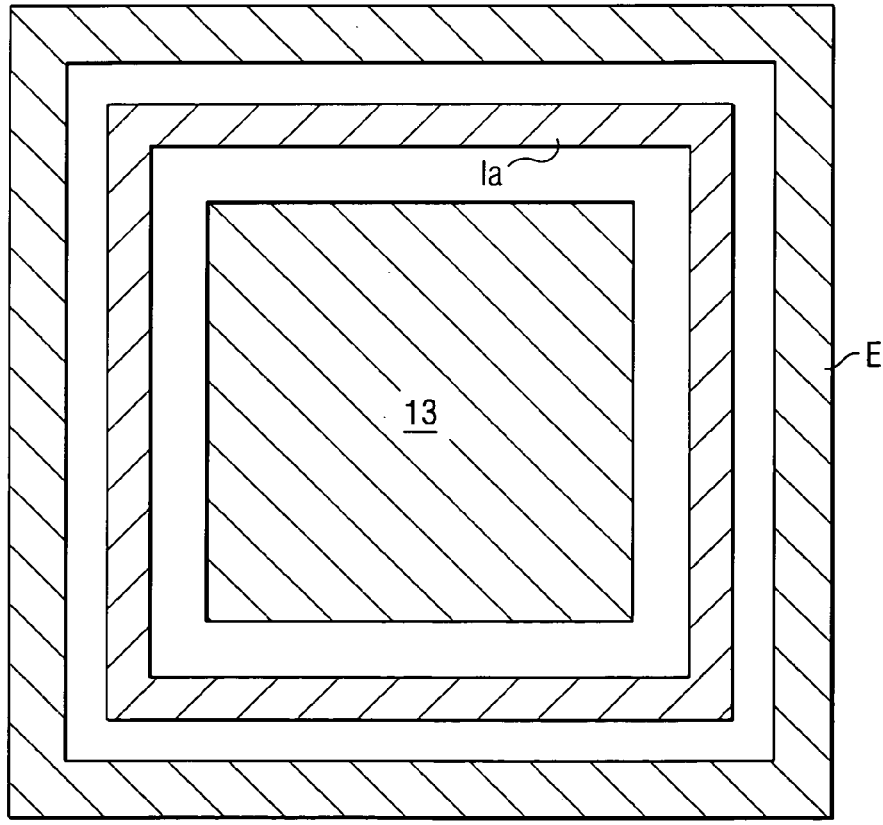
Figure 3A:
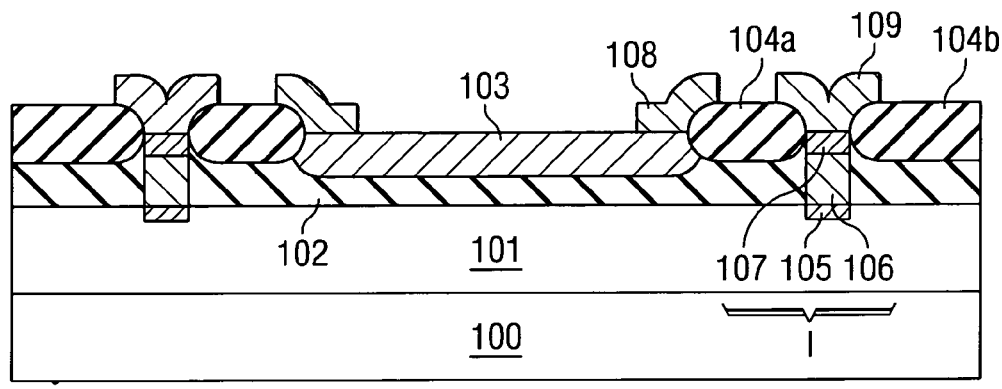
FIG. 3(A) is a cross section pertaining the prior art.
Figure 3B:
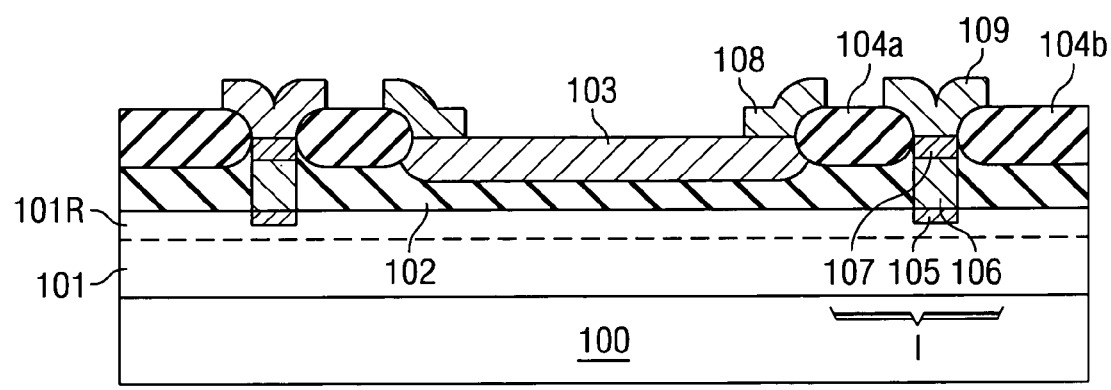
FIG. 3(B) is a cross section illustrating the state of formation of the inversion layer in the semiconductor device shown in FIG. 3(A).
Figure 4:
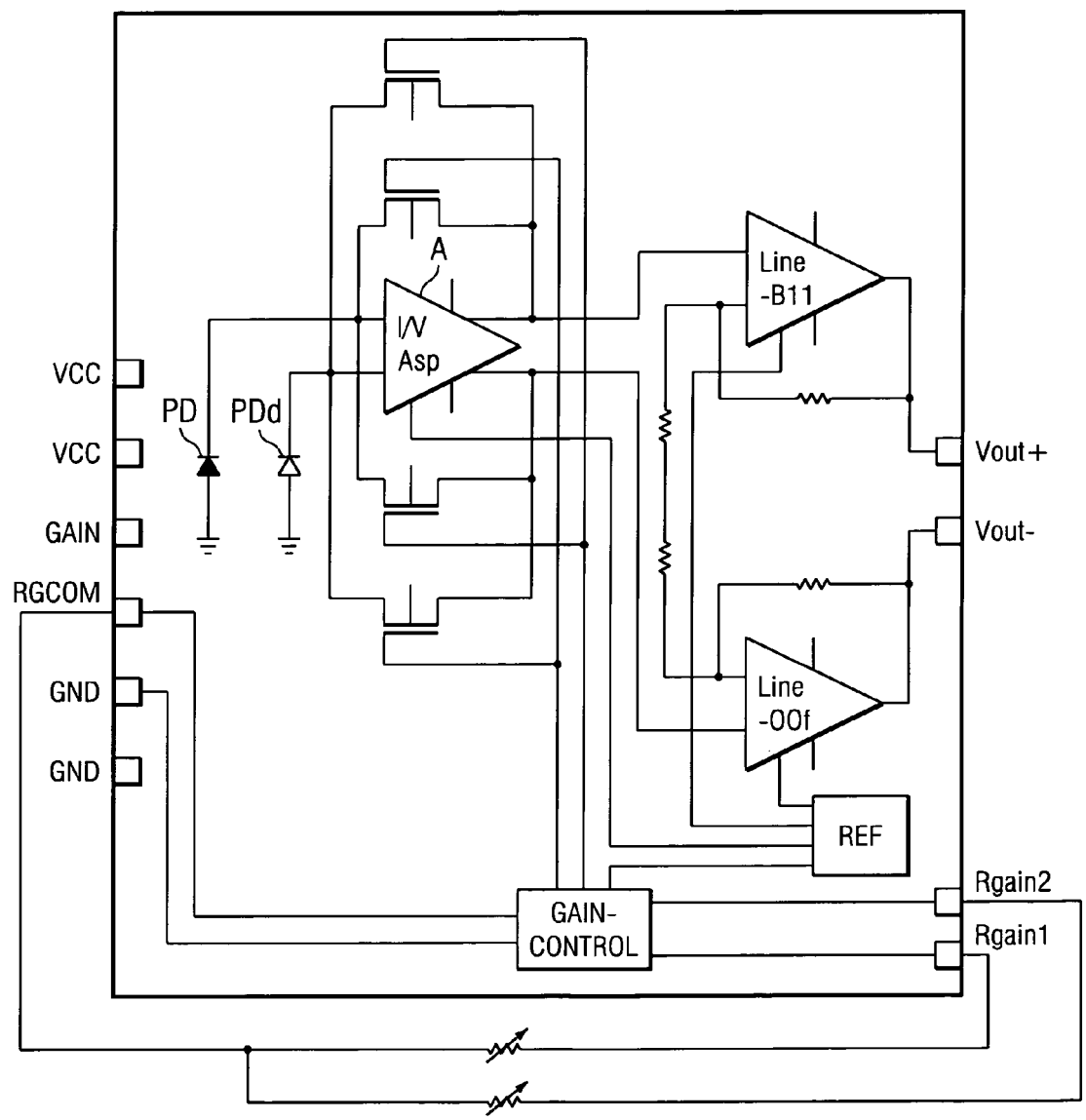
FIG. 4 is a circuit diagram illustrating a PDIC with an integrated photodiode.

FIGS. 2(A) and 2(B) are plan views illustrating examples of the layout of moat regions E. In the scheme shown in FIG. 2(A), moat electrodes E are formed at plural sites on the outer periphery of the photodiode region (2 sites as shown in this figure) via element isolating region Ia and element isolating insulating film 14b. In the scheme shown in FIG. 2(B), each moat region is formed in a ring shape surrounding the outer periphery of the photodiode region.

There is no special limitation on the layout of the moat electrodes. However, one can detect the inversion layer by means of the constitution in which the moat electrode is formed on the outer periphery of the photodiode region.

For the method of inspection of the PIN photodiode in the semiconductor device of this embodiment, the semiconductor device has the following parts: p⁻-type epitaxial layer 11 (first semiconductor layer of the first electroconductive type), n-type epitaxial layer 12 (second semiconductor layer of the second electroconductive type) formed on the principal surface of $p^{31}$-type epitaxial layer 11, p-type element isolating region Ia formed extending through n-type epitaxial layer 12 to reach the outer layer portion of p⁻-type epitaxial layer 11 in order to separate the photodiode regions, and n-type moat region E formed to the outside of the photodiode region isolated by element isolating region Ia extending through n-type epitaxial layer 12 to reach the outer layer portion of p⁻-type epitaxial layer 11. For this semiconductor device, first of all, different prescribed voltages are applied to n-type epitaxial layer 12 in the photodiode region and moat region E, respectively.

In this case, based on the current flowing between n-type epitaxial layer 12 in the photodiode region and moat region E, the presence/absence of an n-type inversion layer formed in the outer layer portion of the first semiconductor layer is detected.

Application of different prescribed voltages to n-type epitaxial layer 12 in the photodiode region and moat region E and detection of the presence/absence of an n-type inversion layer formed in the outer layer portion of p⁻ type epitaxial layer 11 can be performed before the step packaging of the semiconductor device. For example, inspection can be performed at the wafer level.

Also, the current flowing between moat region E and n-type epitaxial layer 12 in the photodiode region enables checking changes in the characteristics of the photodiode in the semiconductor device.

According to the inspection method for the PIN photodiode in the semiconductor device in this embodiment, as explained above, different prescribed voltages are applied to moat electrode E, which is formed to the outside of the photodiode region, isolated by the element isolating regions as aforementioned, extending through n-type epitaxial layer 12 (second semiconductor layer) to reach the outer layer portion of p⁻-type epitaxial layer 11 (first semiconductor layer), and to n-type epitaxial layer 12 in the photodiode region, and the current flowing between the electrode and n-type epitaxial layer 12 in the photodiode region enables detection of the presence/absence of an n-type inversion layer formed in the outer layer portion of p⁻-type epitaxial layer 11.

The semiconductor device having a PIN photodiode can be manufactured as follows.

For example, p⁻-type epitaxial layer 11 as the I layer and n-type epitaxial layer 12 are formed on p⁺⁺-type semiconductor substrate 10 by the epitaxial growth method. During the epitaxial growth, p⁺⁺-type semiconductor regions 15, 16, 24, 25 with a p-type impurity introduced into them are formed. On the other hand, n⁺⁺-type semiconductor regions 20, 21 with an n-type impurity introduced in them are formed. Then the LOCOS element isolating insulating film portions 14a, 14b, 14c are formed to realize element separation.

In addition, p⁺⁺-type semiconductor region 17 is formed connected to p⁺⁺-type semiconductor regions 15, 16 by introducing a p-type impurity in the outer layer portion of n-type epitaxial layer 102, and by introducing an n-type impurity, n⁺-type semiconductor region 13 is formed, as well as n⁺⁺-type semiconductor region 22 connected to n⁺⁺-type semiconductor regions 20, 21.

In addition, for example, using the sputtering method, TiW or another metal layer is deposited, followed by patterning processing to form electrodes 18, 19, 23 connected to n⁺-type semiconductor region 13, p⁺⁺-type semiconductor region 17 and n⁺⁺-type semiconductor region 22, respectively.

As a result, the semiconductor device shown in FIG. 1(A) can be manufactured.

The present invention is not limited to this scheme.

For example, in the aforementioned PIN photodiode, the pn junction is formed by laminating n-type epitaxial layer 12 on p-type epitaxial layer 11 serving as the I layer. However, one may also adopt a scheme in which the electroconductive types are swapped; that is, the PIN photodiode has its pn junction formed by laminating a p-type epitaxial layer on an n-type epitaxial layer as the I layer. In this case, the electroconductive types of element isolating regions Ia, Ib and moat regions E, etc., are also swapped.

In addition, as long as the gist of the present invention is observed, various modifications are allowed.

The semiconductor device of the present invention can be a semiconductor device having a PIN photodiode.

The inspection method for the semiconductor device of the present invention can be adopted as a method for checking a semiconductor device having a PIN photodiode before packaging, such as at the wafer level.

What is claimed is:

1. A semiconductor device including a photodiode region formed on the semiconductor device and isolated by element isolating regions comprising:
    a first semiconductor layer of a first electroconductive type;
    a second semiconductor layer of a second electroconductive type formed on a principal surface of said first semiconductor layer;
    element isolating regions of the first electroconductive type each formed extending through said second semiconductor layer to reach an outer layer portion of said first semiconductor layer in order to isolated said photodiode region; and
    moat regions of the second electroconductive type, each of which is formed extending through said second semiconductor layer to the outside of said photodiode region isolated by said element isolating regions and reaching the outer layer portion of said first semiconductor layer, wherein the moat regions are configured to detect an inversion layer of the second electroconductive type formed in the outer layer portion of said first semiconductor layer by applying a prescribed voltage different from a voltage applied to said second semiconductor layer in said photodiode region to at least one of said moat regions, and detecting current flowing between the at least one of said moat regions and said second semiconductor layer in said photodiode region.

2. The semiconductor device described in claim 1 wherein said moat regions are formed at plural locations to the outside of said photodiode region.

3. The semiconductor device described in claim 1 wherein said moat regions are formed in a ring shape around the outer periphery of said photodiode region.

4. The semiconductor device described in claim 1 wherein current flows between said moat regions and said second semiconductor layer in said photodiode region.

5. A semiconductor device having a photodiode comprising:
    a first semiconductor layer of a first electroconductive type;
    a second semiconductor layer of the first electroconductive type formed on said first semiconductor layer and having an impurity concentration lower than that of said first semiconductor layer;
    a third semiconductor layer of a second electroconductive type formed on said second semiconductor layer;
    a fourth semiconductor layer of the second electroconductive type formed on said third semiconductor layer and having an impurity concentration higher than that of said third semiconductor layer;
    first semiconductor regions of the first electroconductive type and formed extending through said third semiconductor layer from the surface of said third semiconductor layer to reach an outer layer portion of said second semiconductor layer such that said fourth semiconductor layer is surrounded; and
    second semiconductor regions of the second electroconductive type and formed extending through said third semiconductor layer from the surface of said third semiconductor layer to reach the outer layer portion of said second semiconductor layer to an outside of said first semiconductor regions.

6. The semiconductor device described in claim 5 further comprising:
    third semiconductor regions of the first electroconductive type each formed extending through said third semiconductor layer from the surface of said third semiconductor layer to said second semiconductor layer to the outside of each said second semiconductor regions.

7. The semiconductor device described in claim 5 further comprising:
    metal electrodes each connected to said fourth semiconductor layer, and second metal electrodes each connected to said second semiconductor regions.

8. The semiconductor device described in claim 7 wherein when inspection of said photodiode is performed, different voltages are applied to each said first metal electrode and each said second metal electrode to determine conduction between said first metal electrode and said second metal electrode.

* * * * *